US011506702B2

(12) United States Patent
Azam et al.

(10) Patent No.: US 11,506,702 B2
(45) Date of Patent: Nov. 22, 2022

(54) SCALABLE INFIELD SCAN COVERAGE FOR MULTI-CHIP MODULE FOR FUNCTIONAL SAFETY MISSION APPLICATION

(71) Applicant: Intel Corporation, Santa Clara, CA (US)

(72) Inventors: Asad Azam, El Dorado Hills, CA (US); Amit Kumar Srivastava, Folsom, CA (US); Enrico Carrieri, Placerville, CA (US); Rajesh Bhaskar, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 53 days.

(21) Appl. No.: 17/031,107

(22) Filed: Sep. 24, 2020

(65) Prior Publication Data
US 2021/0003629 A1    Jan. 7, 2021

Related U.S. Application Data

(63) Continuation of application No. 16/017,764, filed on Jun. 25, 2018, now Pat. No. 10,845,407.

(51) Int. Cl.
| | |
|---|---|
| *G01R 31/28* | (2006.01) |
| *G01R 31/3177* | (2006.01) |
| *G01R 31/3185* | (2006.01) |
| *G11C 29/32* | (2006.01) |
| *G11C 29/46* | (2006.01) |

(Continued)

(52) U.S. Cl.
CPC ..... *G01R 31/2803* (2013.01); *G01R 31/2818* (2013.01); *G01R 31/3177* (2013.01); *G01R 31/318513* (2013.01); *G01R 31/318572* (2013.01); *G11C 29/08* (2013.01);
(Continued)

(58) Field of Classification Search
CPC ............ G01R 31/2803; G01R 31/2818; G01R 31/3177; G01R 31/318513; G01R 31/318572; G11C 29/32; G11C 29/46; G11C 29/36; G11C 2029/3202; G11C 2029/3602
See application file for complete search history.

(56) References Cited

U.S. PATENT DOCUMENTS

| | | | |
|---|---|---|---|
| 5,621,651 A | 4/1997 | Swoboda | |
| 6,111,414 A * | 8/2000 | Chatterjee | G01R 31/2853 324/633 |

(Continued)

OTHER PUBLICATIONS

Non-Final Office action dated May 7, 2020, to U.S. Appl. No. 16/017,764.

*Primary Examiner* — Esaw T Abraham
(74) *Attorney, Agent, or Firm* — Spectrum IP Law Group LLC

(57) ABSTRACT

An apparatus of a multi-chip package (MCP) of a functional safety system, comprises a processor to be configured as a master chip in a master-slave arrangement with a slave chip in the MCP, and a memory coupled to the processor to store one or more infield test scan patterns. The processor includes a bock to couple the master chip to the slave chip via a high-speed input/output (IO) interface to retrieve the one or more infield test scan patterns from the memory via the master chip, and to provide the one or more infield test scan patterns to the slave chip via the high-speed IO interface in response to the functional safety system entering an infield test mode.

19 Claims, 12 Drawing Sheets

(51) Int. Cl.
  *G11C 29/36* (2006.01)
  *G11C 29/08* (2006.01)

(52) U.S. Cl.
  CPC .............. *G11C 29/32* (2013.01); *G11C 29/36* (2013.01); *G11C 29/46* (2013.01); *G11C 2029/3602* (2013.01)

(56) References Cited

U.S. PATENT DOCUMENTS

| | | | |
|---|---|---|---|
| 6,142,683 A | 11/2000 | Madduri | |
| 6,717,429 B2 | 4/2004 | Whetsel | |
| 7,404,127 B2 | 7/2008 | Whetsel | |
| 7,671,617 B2 * | 3/2010 | Song | G01R 31/318513 324/756.07 |
| 7,937,631 B2 * | 5/2011 | Vogelsang | G11C 29/4401 714/733 |
| 8,185,790 B2 | 5/2012 | Whetsel | |
| 8,259,521 B2 * | 9/2012 | Hung | G11C 29/12005 365/201 |
| 8,261,142 B2 | 9/2012 | Guo et al. | |
| 8,667,350 B2 | 3/2014 | Whetsel | |
| 9,510,738 B2 | 12/2016 | Bärwinkel et al. | |
| 9,996,488 B2 * | 6/2018 | Sengoku | G06F 13/1673 |
| 10,268,409 B2 | 4/2019 | Lee et al. | |
| 10,497,670 B2 * | 12/2019 | Na | G11C 5/025 |
| 10,509,761 B2 * | 12/2019 | Sthoeger | G06F 1/12 |
| 10,614,885 B2 * | 4/2020 | You | G11C 29/00 |
| 2003/0046625 A1 | 3/2003 | Menon et al. | |
| 2004/0064757 A1 | 4/2004 | Jahnke | |
| 2005/0134307 A1 * | 6/2005 | Stojanovic | H04L 25/028 326/31 |
| 2007/0187807 A1 * | 8/2007 | Lee | H01L 23/3107 257/676 |
| 2014/0298122 A1 | 10/2014 | Brambilla et al. | |
| 2017/0084580 A1 * | 3/2017 | Baek | G01R 31/318513 |

* cited by examiner

SCALABLE INFIELD SCAN COVERAGE FOR MULTI-CHIP MODULE FOR FUNCTIONAL SAFETY MISSION APPLICATION

CROSS-REFERENCE TO RELATED APPLICATIONS

The present application is a continuation of US application Ser. No. 16/017,764 filed Jun. 25, 2018, which is now U.S. Pat. No. 10,845,407, issued on Nov. 24, 2020, and is hereby incorporated by reference in its entirety.

FIELD

The present disclosure generally relates to the field of electronics. More particularly, an embodiment relates to infield testing of functional safety control systems.

BACKGROUND

A real-time functional safety control system defines strict Automotive Safety Integrity Level (ASIL) requirements (ISO-26262) for autonomous driving vehicle systems and demands high computational capabilities. Higher computational capacities solution provided by connecting various cores as Multi-Chip Module (MCM) or Multi-Chip Package (MCP). To provide robustness for autonomous safety, an MCP functional System should ensure Lower defects per million (DPM) with a target for ASIL-C being a latent fault metric (LFM) equal to 80% or ASIL-D being an LFM equal to 90% and also periodic in-filed detection and elimination of failing systems. To meet Functional Safety requirement, one of the way achieving is to enable Logic built-in self-test (LBIST) in hybrid mode, but LBIST is not sufficient for coverage. Therefore, hybrid mode scan coverage for the logic/chains which is not covered by LBIST can be targeted with scan patterns applied as top-off or complete test scan patterns. The overall size of the top-off scan patterns, however, can be very large, on the order of 100's of megabytes (MB) within about two seconds, hence these patterns need to be stored off-chip and retrieved fast enough and applied for an infield latent fault testing mechanism through on-demand. Currently there are no solutions providing a functional safety solution for critical intellectual property (IP) functions by enabling scan coverage for MCP and also providing the mechanism to offload data from storage to chips and also in defining a flow in between Chip-to-Chip for MCP during infield testing.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

In the following description, numerous specific details are set forth in order to provide a thorough understanding of various embodiments. However, various embodiments may be practiced without the specific details. In other instances, well-known methods, procedures, components, and circuits have not been described in detail so as not to obscure the particular embodiments. Further, various aspects of embodiments may be performed using various means, such as integrated semiconductor circuits ("hardware"), computer-readable instructions organized into one or more programs ("software"), or some combination of hardware and software. For the purposes of this disclosure reference to "logic" shall mean either hardware, software, firmware, or some combination thereof.

Figure 1A:
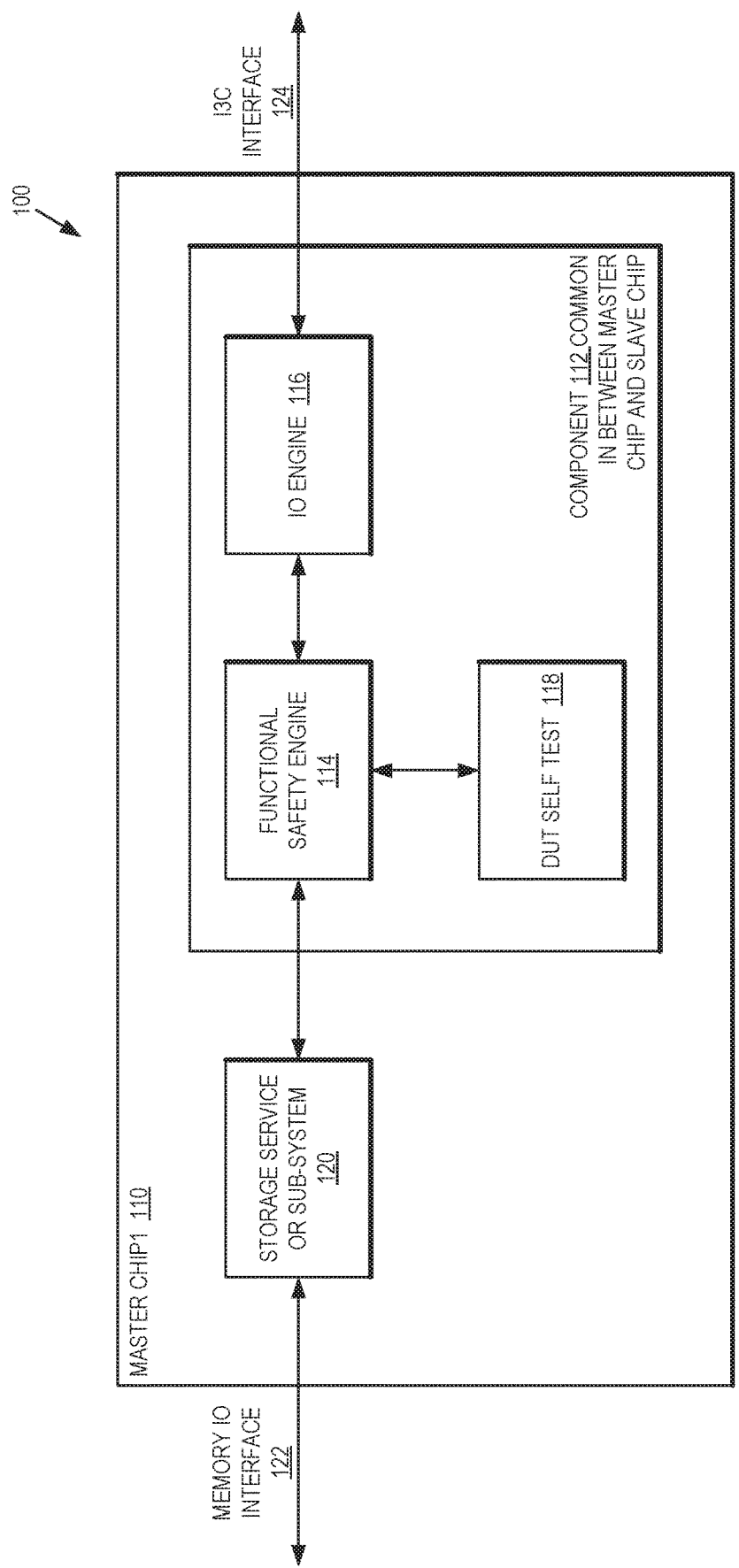
FIG. 1A is a diagram of a high-level block diagram of a system to implement infield testing in accordance with one or more embodiments.

Referring now to FIG. 1A, a diagram of a high-level block diagram of a system to implement infield testing in accordance with one or more embodiments will be discussed. As shown in FIG. 1A, system 100 may comprise a Master Chip1 110 that includes a storage service or sub-system 120 that is responsible for pulling data from storage devices through a memory input/output (IO) interface 122. In one or more embodiments, memory IO interface 122 may comprise an embedded Multi-Media Controller (eMMC) interface, a Secure Digital (SD) memory interface, a Universal Flash Storage (UFS) interface, and so on. Master Chip1 110 may include a common block or component 112 in between Master Chip 1 110 and a Slave Chip (not shown) coupled with Master Chip1 110. Component 112 of Master Chip1 100 may include a Functional Safety Engine 114 that is responsible for enabling an infield test based on system agent indication and to pull stored data from storage devices through the system bus. Functional Safety Engine 114 is also responsible for performing a self-test on a device under test (DUT) 118. Functional Safety Engine 114 also communicates with IO Engine 116 through system bus interfaces. In one or more embodiments, IO Engine 116 may utilize a modified MIPI Alliance I3C multi-lane interface 124 to control data offloaded from one die to another die. Similarly, an IO Engine 116 may be included in the Slave Chip that is responsible for retrieving data from the Master Chip1 110 and to communicate with a Functional Safety Engine 114 at the Slave Chip through a side band bridge or interface. The Functional Safety Engine 114 may test the DUT 118 and compare the scan data from the Master Chip 1 110 with the scan data from the Slave Chip.

The system 100 as shown in FIG. 1A may provide a solution for scalable functional safety infield scan testing for a Multi-Chip Module based on one or more of the following. A scalable high speed (HS) mode multi-lane I3C Link may be used to increase throughput from about 25 megabits per second (MBPS) to about 200 MBPS for short channel reach. Dynamic scalable speed may be achieved for long reach and other use cases for an embedded application. Multi-drop communication may be used for offloading infield data for multi-chip package (MCP) communication. Command Channel configuration may be used to enable infield testing and with an option to provide in-band interrupt. Communication flow may be provided to offload data from storage to MCPs through a generic memory protocol. A side band interface may be used to provide communication flow between the I3C Sub-system and Functional Safety Engine 114 for both the Master Chip1 and the Slave Chip dies. Communication Primary System fabric may be used for communication in between the storage service or sub-system 120 and the Functional Safety Engine 114. A link solution may provide offloading data in-between multi-chip packages. The link solution may comprise scalable bus communication between the MCP chips for example Master Chip1 110 configured as a platform controller hub (PCH) and a companion Chip2 configured as a central processing unit (CPU). The link solution may be dynamically scaled up in frequency by scaling up the number of pins. The system 100 may be applicable for may apply not only to Functional Safety applications but also may apply to client and server applications. The link solution also may be used as an expansion of side band bridge. In addition, the application resets and straps all side in-band communication through the link solution with no dependency on Direct Media Interface and/or On Package DMI interconnect Interface. The link solution also does not require any configuration, fuses, or link training.

Figure 1B:
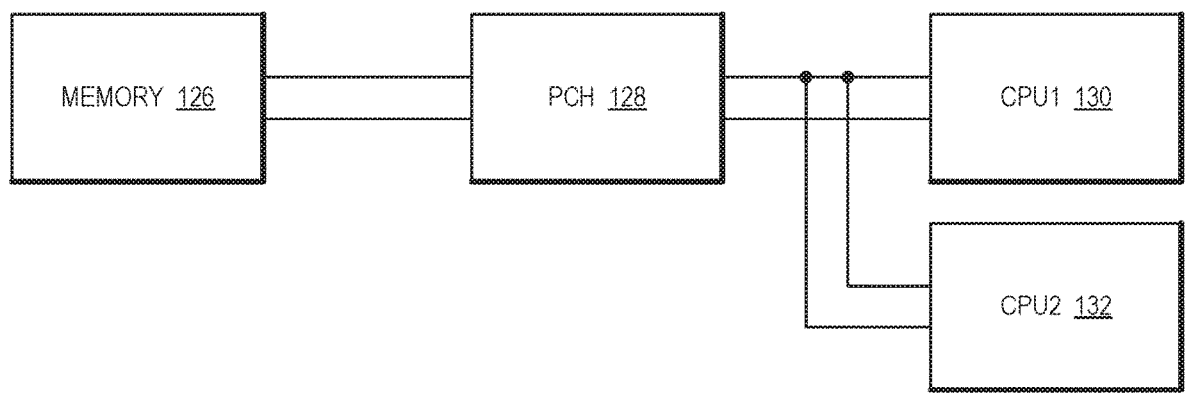
FIG. 1B, FIG. 1C, and FIG. 1D are diagrams showing various communication options for the system of FIG. 1A.
Figure 1C:
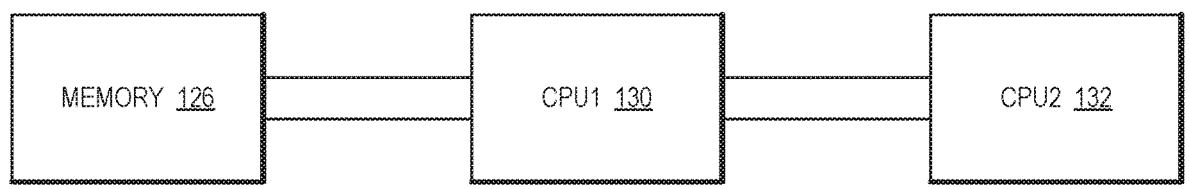
Figure 1D:
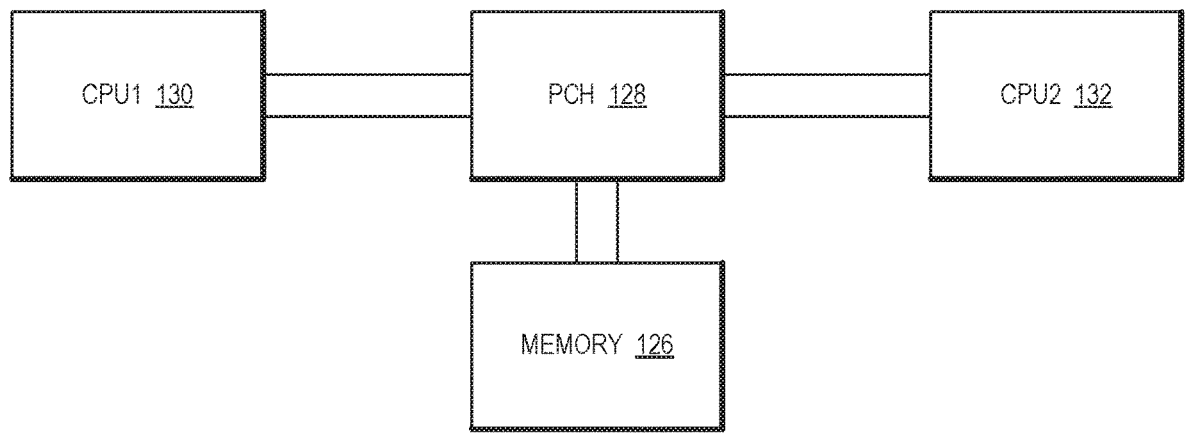

Referring now to FIG. 1B, FIG. 1C, and FIG. 1D, diagrams showing various communication options for the system of FIG. 1A will be discussed. At a high level, communication between chips (chip-to-chip) in a multi-chip platform (MCP) that incorporates system 100 of FIG. 1A may utilize different connection arrangements between chips. In FIG. 1B, a platform controller hub (PCH) 128 may be coupled between a memory 126 and one or more central processing units (CPUs) such as CPU1 130 and CPU2 132 in a multi-drop connection. In FIG. 1C, CPU1 130 may be configured to operate as a PCH between memory 126 and CPU2 132. In FIG. 1D, PCH 128 may be disposed between CPU1 130 and CPU2 132 to couple CPU1 130 and CPU2 132 to memory 126. In this configuration, one PCH 128 is connected to multiple CPUS in the same four lines with data communication occurring between CPU 130 and PCH 128 or between PCH 128 and CPU2 132. In one or more embodiments as an example in FIG. 3 discussed below, memory 126 may comprise storage device 310, PCU 128 may comprise Master Chip1 110, CPU1 130 may comprise Chip2 312, and CPU2 132 may comprise Chip3 314 of FIG. 3, although the scope of the claimed subject matter is not limited in this respect. In general, one chip of a MCP may be configured to operate as a PCH, and one or more other chips of the MCP may be configured to operate as one or more CPUs, although the scope of the claimed subject matter is not limited in these respects.

Figure 2:
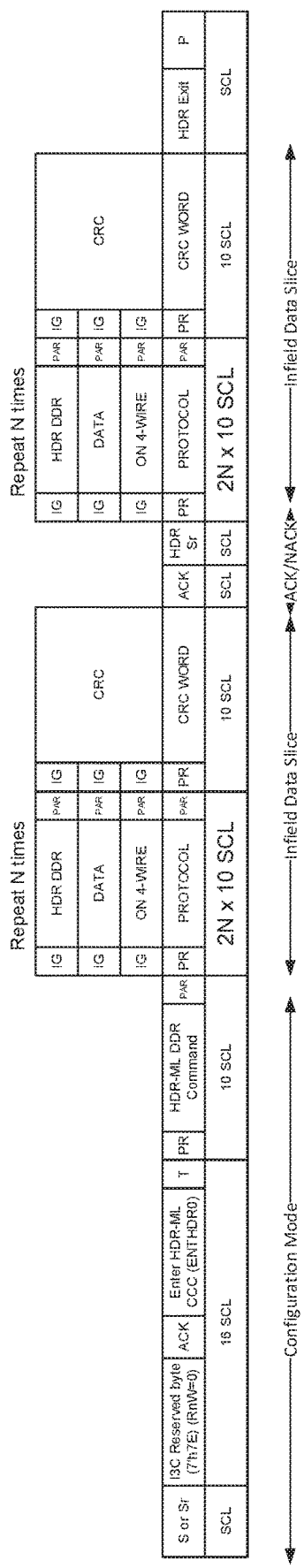
FIG. 2 is a diagram of a command slicing in a high-speed input/output (IO) interface in accordance with one or more embodiments.

Referring now to FIG. 2, a diagram of a command slicing in a high-speed input/output (IO) interface in accordance with one or more embodiments will be discussed. FIG. 2 illustrates the key changes to the current I3C interface to result in a 64× enhancement and to enable infield testing. Bandwidth may be increased via enabling Multi-Lane providing four times (4×) the bandwidth. Bandwidth also may be increased via the use of double data rate (DDR) data transfer over Multi-Lane to provide another two time (2×) the bandwidth. Furthermore, bandwidth may be increased via over clocking at a clock rate of eight times (8×) bandwidth also enable further enhancement of bandwidth. Enhancement of the protocol may be provided via the use of command slicing and providing the flexibility to slave to acknowledgement/negative acknowledgement (ACK/NACK) per slices. Any NACK may result in three times retrying of particular slices or otherwise dropping link data. In addition, a special command may be defined to configure the infield test mode. A low voltage of about 1 volt (V) for the IO interface for communications may be provided. A fixed static address may be used for Slave chips. Furthermore, I3C may be used to enable in-band interrupt capability and in-band wake capability.

Figure 3:
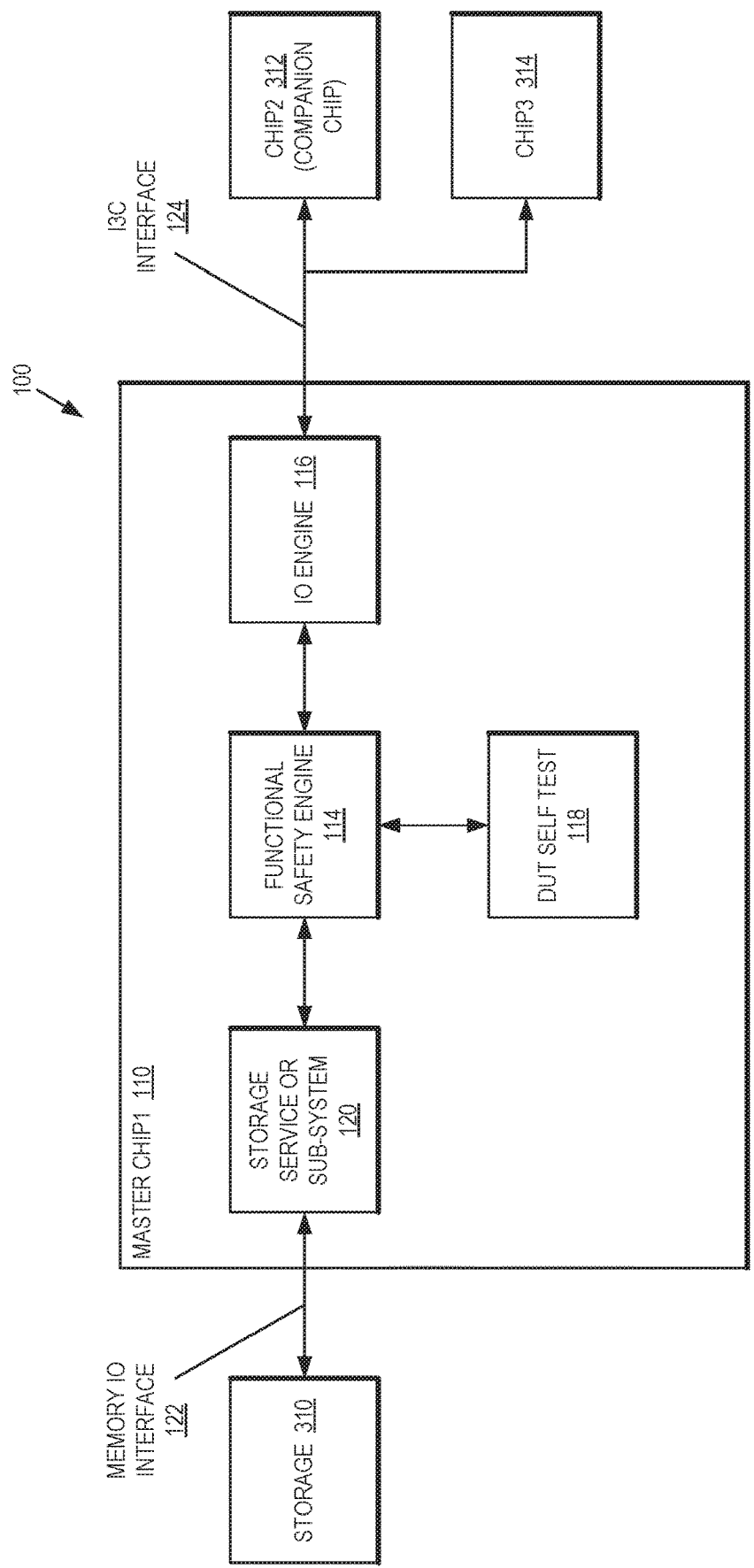
FIG. 3 is a diagram of a system to offload infield test data using a high-speed input/output (IO) interface in accordance with one or more embodiments.

Referring now to FIG. 3, a diagram of a system to offload infield test data using a high-speed input/output (IO) interface in accordance with one or more embodiments will be discussed. FIG. 3 illustrates the system 100 of FIG. 1A and further shows the storage 310 from which data may be pulled and offloaded from the storage 310 to one or more chips connected as multi-drop via I3C interface 124 such as Chip2 312 (companion chip) or Chip3 314. Each of the chips may be connected through multi-drop and may be used for infield testing, for example as shown in and described with respect to FIG. 4A and FIG. 4B below.

Figure 4A:
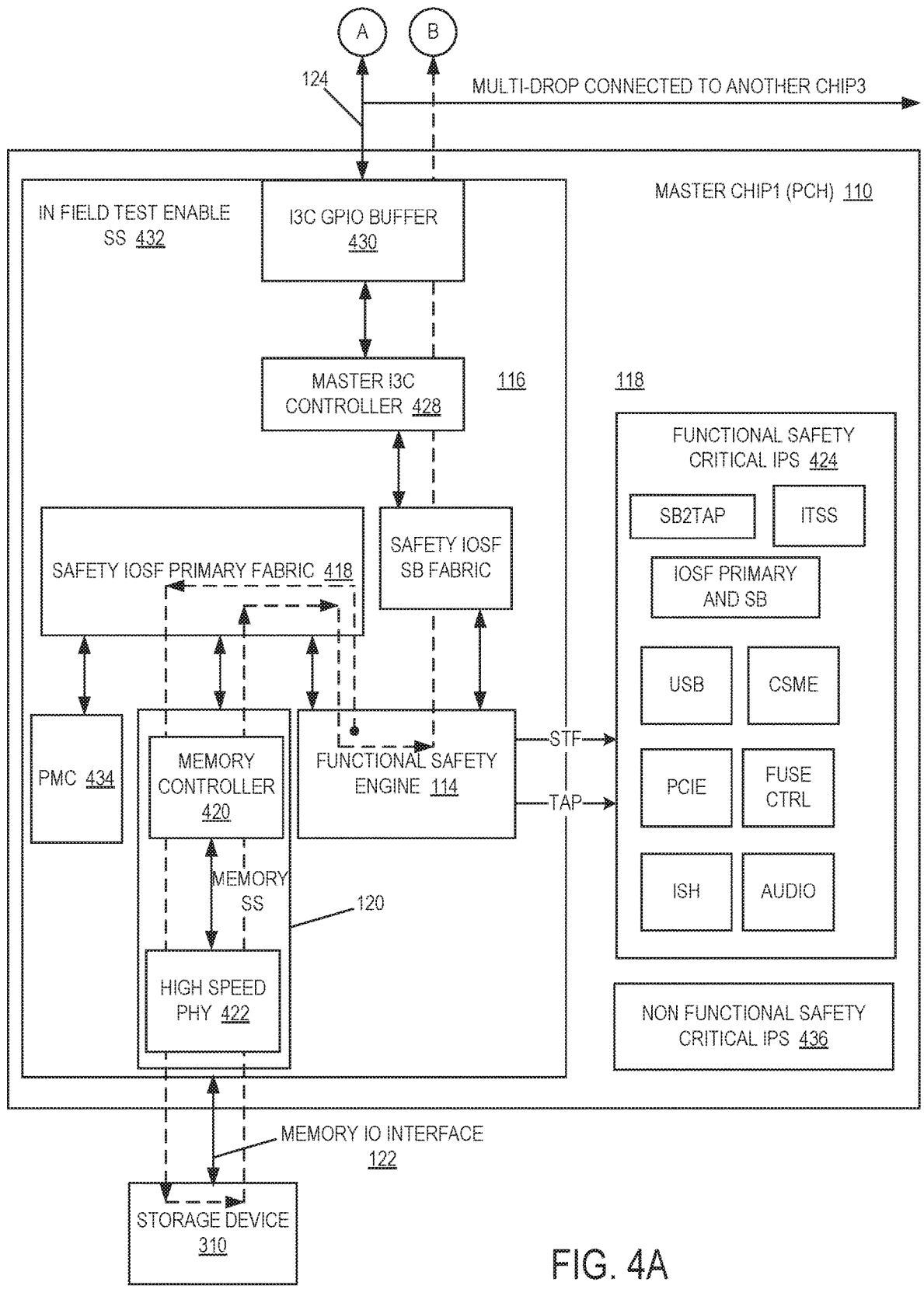
FIG. 4A and FIG. 4B are block diagrams of a flow to offload data in a functional safety control system in accordance with one or more embodiments.
Figure 4B:
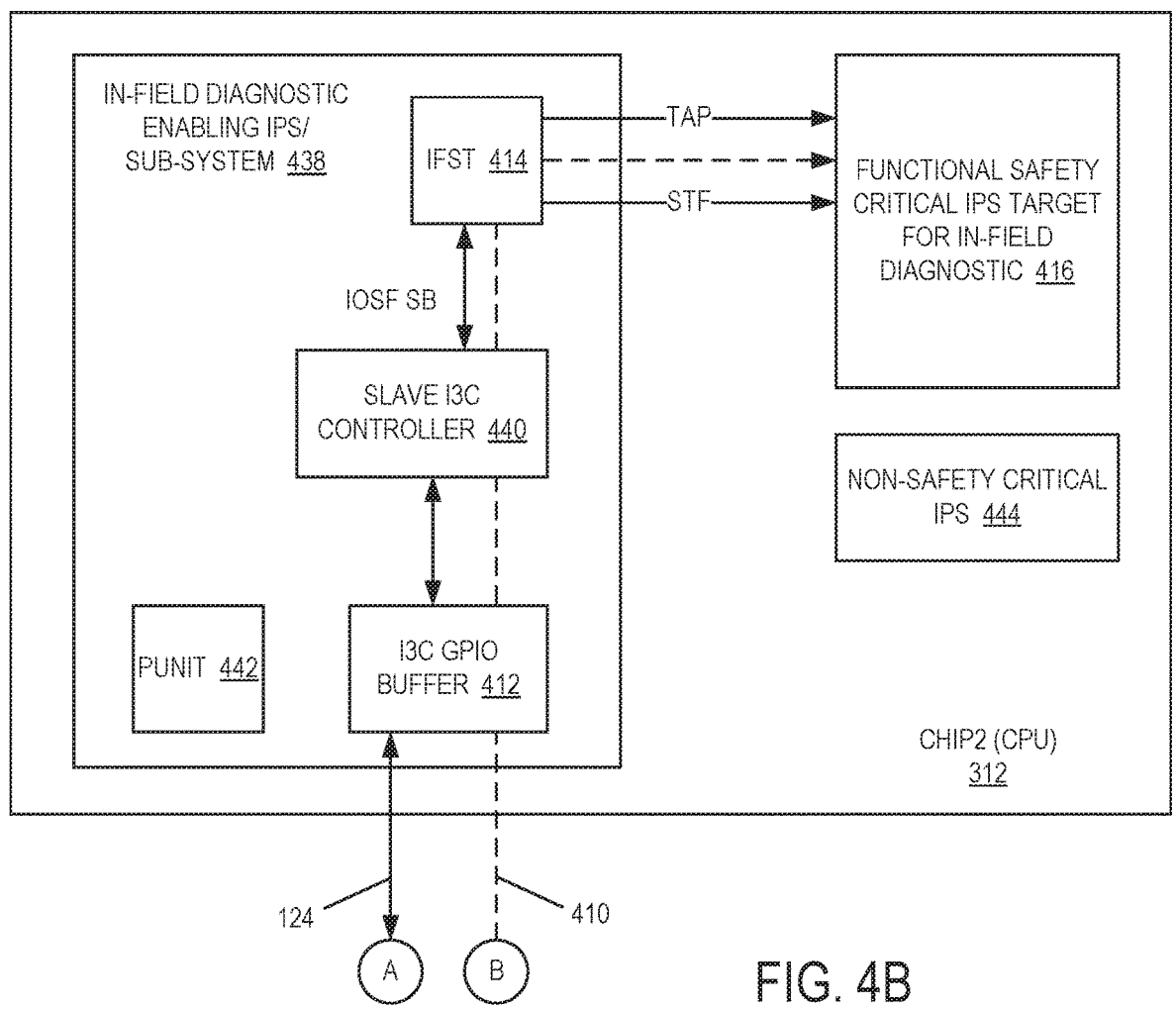

Referring now to FIG. 4A and FIG. 4B, block diagrams of a flow to offload data in a functional safety control system in accordance with one or more embodiments will be discussed. FIG. 4A and FIG. 4B illustrate a high-level flow for offloading infield testing wherein the flow 410 is indicated by the dashed line. In a first operation, Master Chip1 110 of system 100 as a System on Chip (SoC) places Functional Safety Engine 114 into a diagnostic mode. In a second operation, Master Chip1 110 (FIG. 4A) may be configured as a primary controller hub (PCH) in a Master Mode configuration, and in a third operation, Chip2 312 (FIG. 4B) may be configured as a central processing unit (CPU) in a Slave Mode configuration with a Fixed Device address. In a fourth operation, Master Chip1 110 as a PCH communicates a Clear Command Channel (CCC) command to indicate to Chip2 312 as a CPU for offloading infield test data to Chip2 312 in addition to the mode of operation, for example 200 MBPS using 4×SDA in Multi-lane mode and to Enter multi-lane (ML) double data rate (DDR) high-speed (HS) mode command to provide information on data slicing, read/write, and so on. In a fifth operation, Chip2 312 sends an acknowledgement (ACK) to Chip1 110 in response to the CCC command. In a sixth operation, Chip1 110 pulls data from storage sub-system 120 through PSF and fetches data from storage device 310 to Chip2 312 through Side band over IO engine 116 through the I3C interface 124. Master Chip1 110 at the same time run self-diagnostic for its Functional Safety Critical IPs under test as the DUT 118. In a seventh operation, Chip2 312 may send a negative acknowledgment (NACK) to Master Chip1 110 if the buffer 412 of Chip2 312 is full in order to wait for next data slices to be ready. In an eighth operation, Chip2 312 forwards the data received from Master Chip1 110 over I3C interface 124 to the infield engine 414 through SB Link in order to run on or more diagnostics of the critical IPs 416 of Chip2 312.

As shown in FIG. 4A, in one or more embodiments flow 410 may be as follows. As part of Infield Test Enable Safety System (SS) 432, Functional Safety Engine 114 of Master Chip1 110 issues a command through Safety Intel On-chip System Fabric (PSF) Primary Fabric 418 to memory controller 420 of storage service or sub-system 120. Memory controller 420 fetches the data from storage device 310 via high speed physical layer (PHY) device 422 and provides the data back to Functional Safety Engine 114. Functional Safety Engine 114 may provide infield testing of its Functional Safety Critical IPs 424 and may also transmit the data to Chip2 312 via Safety System sideband fabric 426, for example at a rate of one gigatransfers per second (GT/s), to IO Engine 116 comprising Master I3C Controller 428 at a bandwidth of 400 megabytes (MB) per second and I3C general-purpose IO (GPIO) buffer 430. The data is then offloaded to Chip2 312 over I3C interface 124 for example at a rate of 200 MB per second. Infield Test Enable SS 432 also may include a power monitoring controller (PMC) 434, and Master Chip1 110 also may include non-Functional Safety Critical IPs 436. I3C interface 124 may provide a multi-drop connection to Chip2 312 of FIG. 4B and optionally to one or more other chips such as Chip3 314, although the scope of the claimed subject matter is not limited in this respect.

As shown in FIG. 4B, Chip2 312 may be coupled at point A and point B to Master Chip1 110 of FIG. 4B. The data may continue over flow 410 from Master Chip1 110 to Chip2 312 to Infield Diagnostic Enabling IPs/Subsystem 438 via I3C GPIO buffer 412, slave I3C controller. The data may then be provided to Infield Functional Safety Test (IFST) block 414, for example at a rate of 400 MB per second, to perform the diagnostics of Functional Safety Critical IPs Target for Infield Diagnostic 416, for example at a rate of 400 MB per second. Infield Diagnostic Enabling IPs/Subsystem 438 may include power control unit (PUNIT) block 442 and non-Functional Safety Critical IPs 444.

Figure 5:
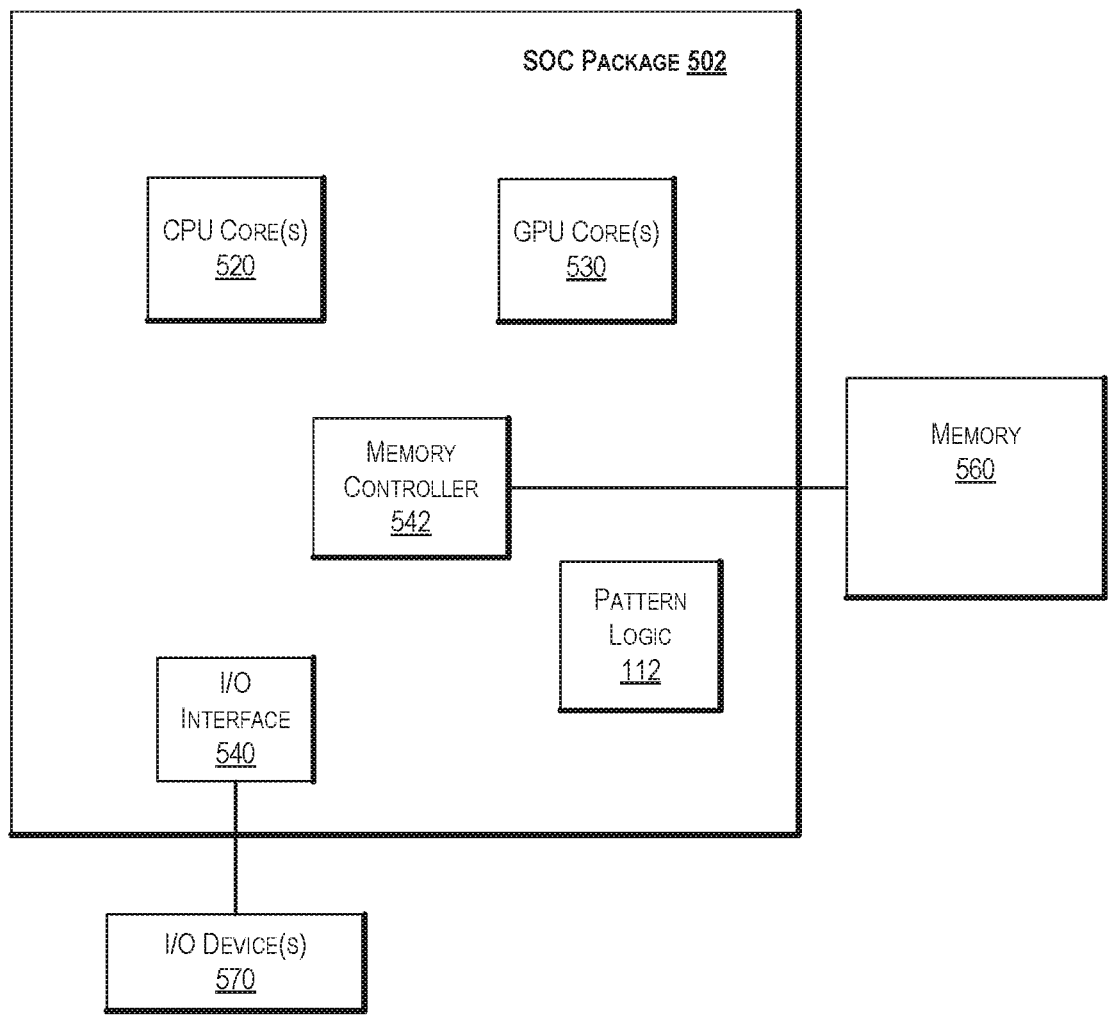
FIG. 5 illustrates a block diagram of a system on chip (SOC) package in accordance with an embodiment.

FIG. 5 illustrates a block diagram of a system on chip (SOC) package in accordance with an embodiment. As illustrated in FIG. 5, SOC 502 includes one or more Central Processing Unit (CPU) cores 520, one or more Graphics Processor Unit (GPU) cores 530, an Input/Output (I/O) interface 540, and a memory controller 542. Various components of the SOC package 502 may be coupled to an interconnect or bus such as discussed herein with reference to the other figures. Also, the SOC package 502 may include more or less components, such as those discussed herein with reference to the other figures. Further, each component of the SOC package 520 may include one or more other components, e.g., as discussed with reference to the other figures herein. In one embodiment, SOC package 502 (and its components) is provided on one or more Integrated Circuit (IC) die, e.g., which are packaged into a single semiconductor device.

As illustrated in FIG. 5, SOC package 502 is coupled to a memory 560 via the memory controller 542. In an embodiment, the memory 660 (or a portion of it) can be integrated on the SOC package 502.

The I/O interface 540 may be coupled to one or more I/O devices 570, e.g., via an interconnect and/or bus such as discussed herein with reference to other figures. I/O device(s) 570 may include one or more of a keyboard, a mouse, a touchpad, a display, an image/video capture device (such as a camera or camcorder/video recorder), a touch screen, a speaker, or the like.

Figure 6:
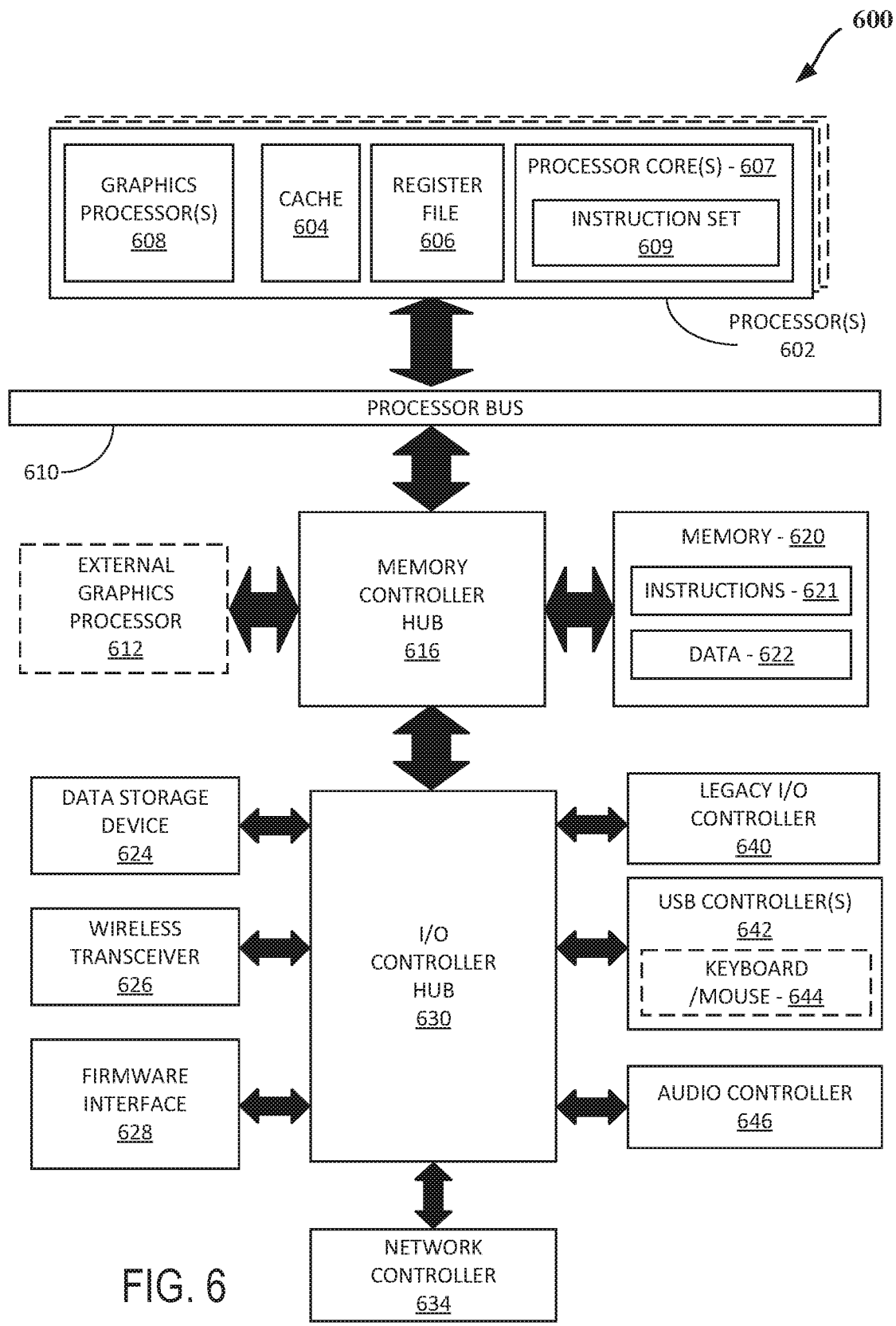
FIG. 6 is a block diagram of a processing system according to an embodiment.

FIG. 6 is a block diagram of a processing system 600, according to an embodiment. In various embodiments the system 600 includes one or more processors 602 and one or more graphics processors 608, and may be a single processor desktop system, a multiprocessor workstation system, or a server system having a large number of processors 602 or processor cores 607. In on embodiment, the system 600 is a processing platform incorporated within a system-on-a-chip (SoC or SOC) integrated circuit for use in mobile, handheld, or embedded devices.

An embodiment of system 600 can include, or be incorporated within a server-based gaming platform, a game console, including a game and media console, a mobile gaming console, a handheld game console, or an online game console. In some embodiments system 600 is a mobile phone, smart phone, tablet computing device or mobile Internet device. Data processing system 600 can also include, couple with, or be integrated within a wearable device, such as a smart watch wearable device, smart eyewear device, augmented reality device, or virtual reality device. In some embodiments, data processing system 600 is a television or set top box device having one or more processors 602 and a graphical interface generated by one or more graphics processors 608.

In some embodiments, the one or more processors 602 each include one or more processor cores 607 to process instructions which, when executed, perform operations for system and user software. In some embodiments, each of the one or more processor cores 607 is configured to process a specific instruction set 609. In some embodiments, instruction set 609 may facilitate Complex Instruction Set Computing (CISC), Reduced Instruction Set Computing (RISC), or computing via a Very Long Instruction Word (VLIW). Multiple processor cores 607 may each process a different instruction set 609, which may include instructions to facilitate the emulation of other instruction sets. Processor core 607 may also include other processing devices, such a Digital Signal Processor (DSP).

In some embodiments, the processor 602 includes cache memory 604. Depending on the architecture, the processor 702 can have a single internal cache or multiple levels of internal cache. In some embodiments, the cache memory is shared among various components of the processor 602. In some embodiments, the processor 602 also uses an external cache (e.g., a Level-3 (L3) cache or Last Level Cache (LLC)) (not shown), which may be shared among processor cores 607 using known cache coherency techniques. A register file 606 is additionally included in processor 602 which may include different types of registers for storing different types of data (e.g., integer registers, floating point registers, status registers, and an instruction pointer register). Some registers may be general-purpose registers, while other registers may be specific to the design of the processor 602.

In some embodiments, processor 602 is coupled to a processor bus 610 to transmit communication signals such as address, data, or control signals between processor 602 and other components in system 600. In one embodiment the system 600 uses an exemplary "hub" system architecture, including a memory controller hub 616 and an Input Output (I/O) controller hub 630. A memory controller hub 616 facilitates communication between a memory device and other components of system 600, while an I/O Controller Hub (ICH) 630 provides connections to I/O devices via a local I/O bus. In one embodiment, the logic of the memory controller hub 616 is integrated within the processor.

Memory device 620 can be a dynamic random-access memory (DRAM) device, a static random-access memory (SRAM) device, flash memory device, phase-change memory device, or some other memory device having suitable performance to serve as process memory. In one embodiment the memory device 620 can operate as system memory for the system 600, to store data 622 and instructions 621 for use when the one or more processors 602 executes an application or process. Memory controller hub 616 also couples with an optional external graphics processor 612, which may communicate with the one or more graphics processors 608 in processors 602 to perform graphics and media operations.

In some embodiments, ICH 630 enables peripherals to connect to memory device 620 and processor 602 via a high-speed I/O bus. The I/O peripherals include, but are not limited to, an audio controller 646, a firmware interface 628, a wireless transceiver 626 (e.g., Wi-Fi, Bluetooth), a data storage device 624 (e.g., hard disk drive, flash memory, etc.), and a legacy I/O controller 640 for coupling legacy (e.g., Personal System 2 (PS/2)) devices to the system. One or more Universal Serial Bus (USB) controllers 642 connect input devices, such as keyboard and mouse 644 combinations. A network controller 634 may also couple to ICH 630. In some embodiments, a high-performance network controller (not shown) couples to processor bus 610. It will be appreciated that the system 600 shown is exemplary and not limiting, as other types of data processing systems that are differently configured may also be used. For example, the I/O controller hub 630 may be integrated within the one or more processor 602, or the memory controller hub 616 and I/O controller hub 630 may be integrated into a discreet external graphics processor, such as the external graphics processor 612.

Figure 7:
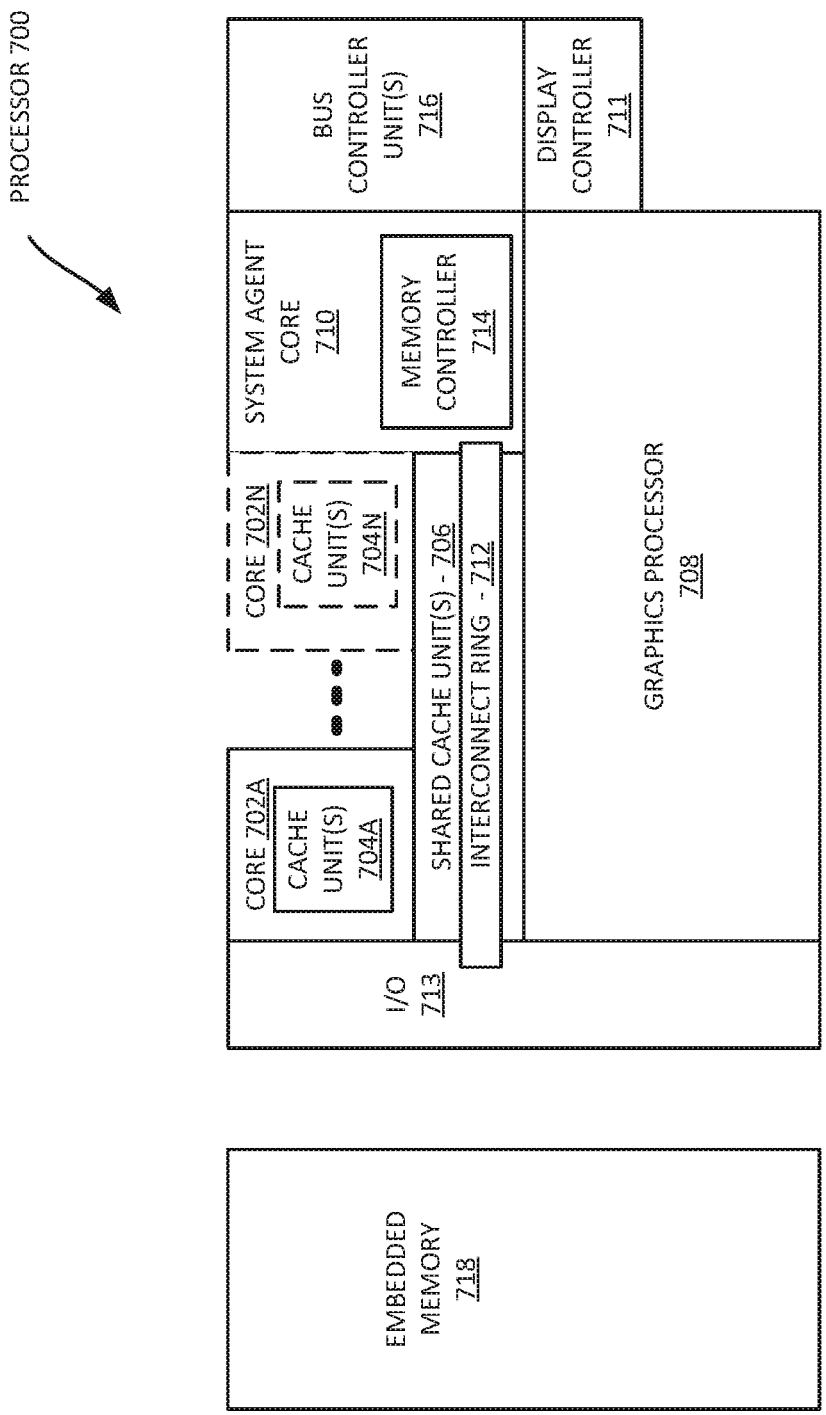
FIG. 7 is a block diagram of a processor having one or more processor cores, an integrated memory controller, and an integrated graphics processor in accordance with one or more embodiments.

FIG. 7 is a block diagram of an embodiment of a processor 700 having one or more processor cores 702A to 702N, an integrated memory controller 714, and an integrated graphics processor 708. Those elements of FIG. 7 having the same reference numbers (or names) as the elements of any other figure herein can operate or function in any manner similar to that described elsewhere herein but are not limited to such. Processor 700 can include additional cores up to and including additional core 702N represented by the dashed lined boxes. Each of processor cores 702A to 702N includes one or more internal cache units 704A to 704N. In some embodiments each processor core also has access to one or more shared cached units 706.

The internal cache units 704A to 704N and shared cache units 706 represent a cache memory hierarchy within the processor 700. The cache memory hierarchy may include at least one level of instruction and data cache within each processor core and one or more levels of shared mid-level cache, such as a Level 2 (L2), Level 3 (L3), Level 4 (L4), or other levels of cache, where the highest level of cache before external memory is classified as the LLC. In some embodiments, cache coherency logic maintains coherency between the various cache units 706 and 704A to 704N.

In some embodiments, processor 700 may also include a set of one or more bus controller units 716 and a system agent core 710. The one or more bus controller units 716 manage a set of peripheral buses, such as one or more Peripheral Component Interconnect buses (e.g., PCI, PCI Express). System agent core 710 provides management functionality for the various processor components. In some embodiments, system agent core 710 includes one or more integrated memory controllers 714 to manage access to various external memory devices (not shown).

In some embodiments, one or more of the processor cores 702A to 702N include support for simultaneous multi-threading. In such embodiment, the system agent core 710 includes components for coordinating and operating cores 702A to 702N during multi-threaded processing. System agent core 710 may additionally include a power control unit (PCU), which includes logic and components to regulate the power state of processor cores 702A to 702N and graphics processor 708.

In some embodiments, processor 700 additionally includes graphics processor 708 to execute graphics processing operations. In some embodiments, the graphics processor 708 couples with the set of shared cache units 706, and the system agent core 710, including the one or more integrated memory controllers 714. In some embodiments, a display controller 711 is coupled with the graphics processor 708 to drive graphics processor output to one or more coupled displays. In some embodiments, display controller 711 may be a separate module coupled with the graphics processor via at least one interconnect, or may be integrated within the graphics processor 708 or system agent core 710.

In some embodiments, a ring based interconnect unit 712 is used to couple the internal components of the processor 700. However, an alternative interconnect unit may be used, such as a point-to-point interconnect, a switched interconnect, or other techniques, including techniques well known in the art. In some embodiments, graphics processor 708 couples with the ring interconnect 712 via an I/O link 713.

The exemplary I/O link 713 represents at least one of multiple varieties of I/O interconnects, including an on package I/O interconnect which facilitates communication between various processor components and a high-performance embedded memory module 718, such as an eDRAM (or embedded DRAM) module. In some embodiments, each of the processor cores 702 to 702N and graphics processor 808 use embedded memory modules 718 as a shared Last Level Cache.

In some embodiments, processor cores 702A to 702N are homogenous cores executing the same instruction set architecture. In another embodiment, processor cores 702A to 702N are heterogeneous in terms of instruction set architecture (ISA), where one or more of processor cores 702A to 702N execute a first instruction set, while at least one of the other cores executes a subset of the first instruction set or a different instruction set. In one embodiment processor cores 702A to 702N are heterogeneous in terms of microarchitecture, where one or more cores having a relatively higher power consumption couple with one or more power cores having a lower power consumption. Additionally, processor 700 can be implemented on one or more chips or as an SoC integrated circuit having the illustrated components, in addition to other components.

Figure 8:
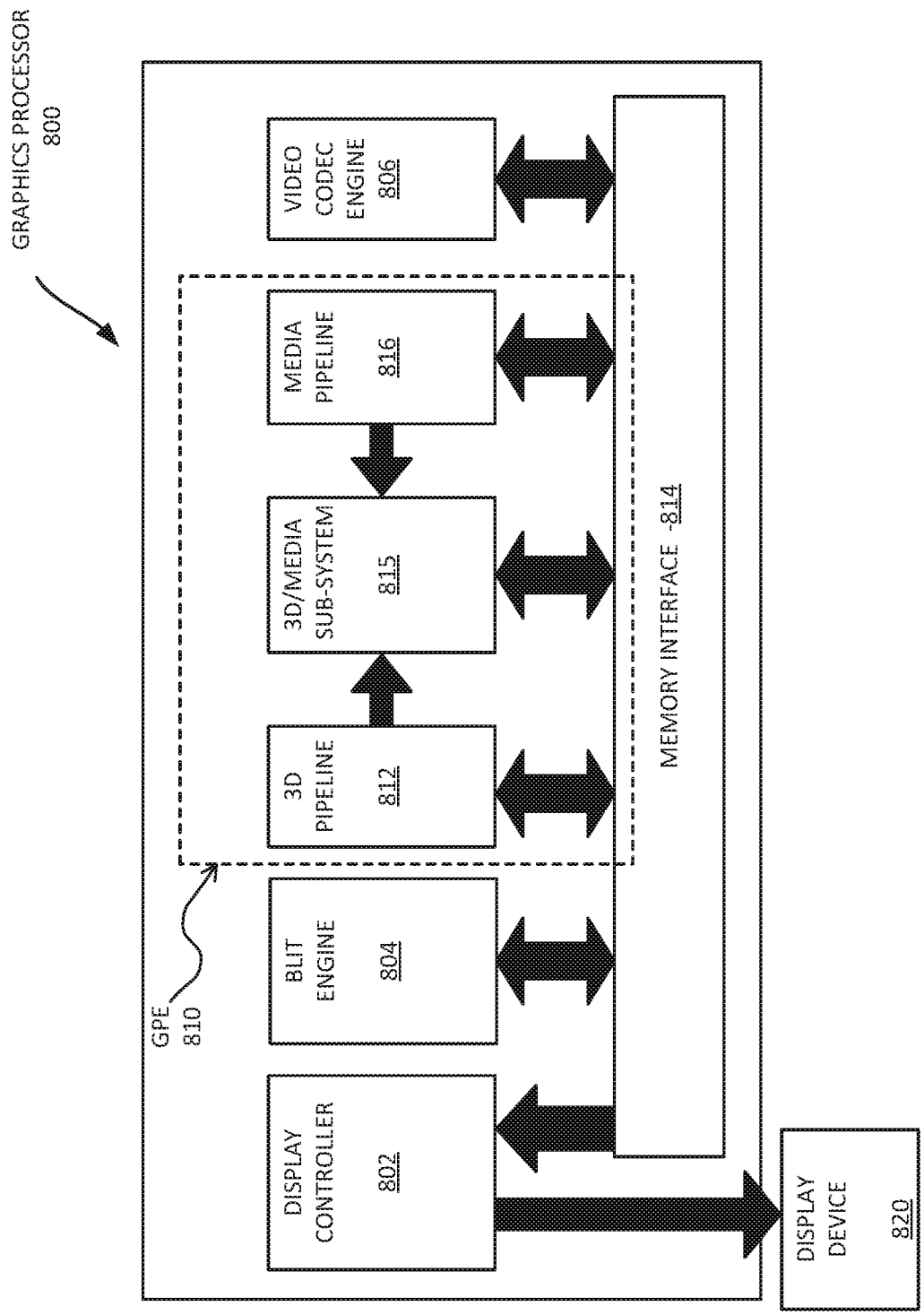
FIG. 8 is a block diagram of a graphics processor, which may be a discrete graphics processing unit, or may be a graphics processor integrated with a plurality of processing cores in accordance with one or more embodiments.

FIG. 8 is a block diagram of a graphics processor 800, which may be a discrete graphics processing unit, or may be a graphics processor integrated with a plurality of processing cores. In some embodiments, the graphics processor communicates via a memory mapped I/O interface to registers on the graphics processor and with commands placed into the processor memory. In some embodiments, graphics processor 800 includes a memory interface 814 to access memory. Memory interface 814 can be an interface to local memory, one or more internal caches, one or more shared external caches, and/or to system memory.

In some embodiments, graphics processor 800 also includes a display controller 802 to drive display output data to a display device 820. Display controller 802 includes hardware for one or more overlay planes for the display and composition of multiple layers of video or user interface elements. In some embodiments, graphics processor 800 includes a video codec engine 806 to encode, decode, or transcode media to, from, or between one or more media encoding formats, including, but not limited to Moving Picture Experts Group (MPEG) formats such as MPEG-2, Advanced Video Coding (AVC) formats such as H.264/MPEG-4 AVC, as well as the Society of Motion Picture & Television Engineers (SMPTE) 421M/VC-1, and Joint Photographic Experts Group (JPEG) formats such as JPEG, and Motion JPEG (MJPEG) formats.

In some embodiments, graphics processor 800 includes a block image transfer (BLIT) engine 804 to perform two-dimensional (2D) rasterizer operations including, for example, bit-boundary block transfers. However, in one embodiment, 2D graphics operations are performed using one or more components of graphics processing engine (GPE) 810. In some embodiments, graphics processing engine 810 is a compute engine for performing graphics operations, including three-dimensional (3D) graphics operations and media operations.

In some embodiments, GPE 810 includes a 3D pipeline 812 for performing 3D operations, such as rendering three-dimensional images and scenes using processing functions that act upon 3D primitive shapes (e.g., rectangle, triangle, etc.). The 3D pipeline 812 includes programmable and fixed function elements that perform various tasks within the element and/or spawn execution threads to a 3D/Media sub-system 815. While 3D pipeline 812 can be used to perform media operations, an embodiment of GPE 810 also includes a media pipeline 816 that is specifically used to perform media operations, such as video post-processing and image enhancement.

In some embodiments, media pipeline 816 includes fixed function or programmable logic units to perform one or more specialized media operations, such as video decode acceleration, video de-interlacing, and video encode acceleration in place of, or on behalf of video codec engine 806. In some embodiments, media pipeline 816 additionally includes a thread spawning unit to spawn threads for execution on 3D/Media sub-system 815. The spawned threads perform computations for the media operations on one or more graphics execution units included in 3D/Media subsystem 815.

In some embodiments, 3D/Media subsystem 815 includes logic for executing threads spawned by 3D pipeline 812 and media pipeline 816. In one embodiment, the pipelines send thread execution requests to 3D/Media subsystem 815, which includes thread dispatch logic for arbitrating and dispatching the various requests to available thread execution resources. The execution resources include an array of graphics execution units to process the 3D and media threads. In some embodiments, 3D/Media subsystem 815 includes one or more internal caches for thread instructions and data. In some embodiments, the subsystem also includes shared memory, including registers and addressable memory, to share data between threads and to store output data.

Figure 9:
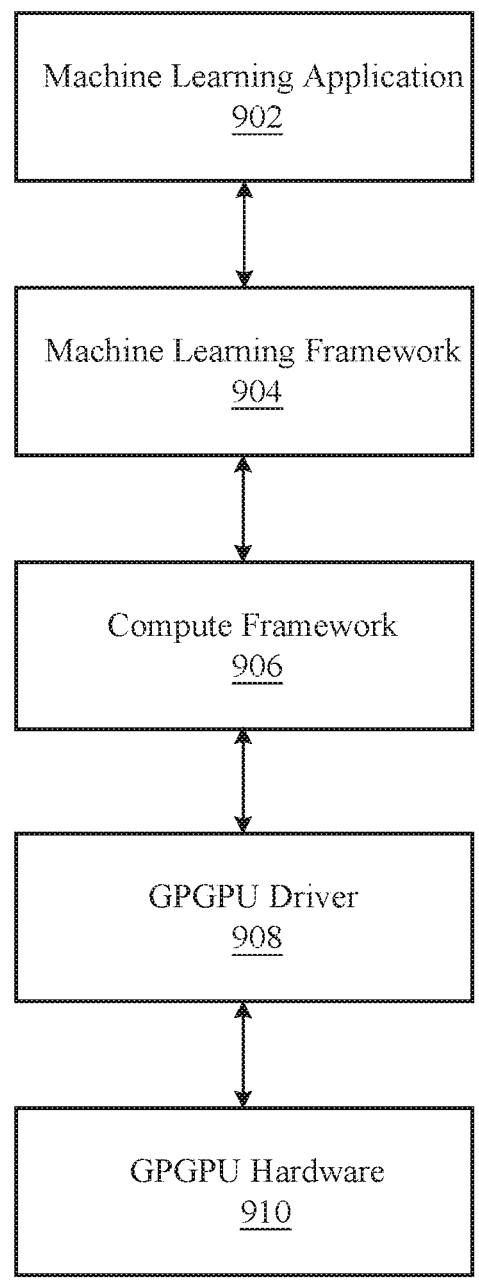
FIG. 9 is a generalized diagram of a machine learning software stack in accordance with one or more embodiments.

FIG. 9 is a generalized diagram of a machine learning software stack 900. A machine learning application 1102 can be configured to train a neural network using a training dataset or to use a trained deep neural network to implement machine intelligence. The machine learning application 902 can include training and inference functionality for a neural network and/or specialized software that can be used to train a neural network before deployment. The machine learning application 902 can implement any type of machine intelligence including but not limited to image recognition, mapping and localization, autonomous navigation, speech synthesis, medical imaging, or language translation.

Hardware acceleration for the machine learning application 902 can be enabled via a machine learning framework 904. The machine learning framework 904 can provide a library of machine learning primitives. Machine learning primitives are basic operations that are commonly performed by machine learning algorithms. Without the machine learning framework 904, developers of machine learning algorithms would be required to create and optimize the main computational logic associated with the machine learning algorithm, then re-optimize the computational logic as new parallel processors are developed. Instead, the machine learning application can be configured to perform the necessary computations using the primitives provided by the machine learning framework 904. Exemplary primitives include tensor convolutions, activation functions, and pooling, which are computational operations that are performed while training a convolutional neural network (CNN). The machine learning framework 904 can also provide primitives to implement basic linear algebra subprograms performed by many machine-learning algorithms, such as matrix and vector operations.

The machine learning framework 904 can process input data received from the machine learning application 902 and generate the appropriate input to a compute framework 906. The compute framework 906 can abstract the underlying instructions provided to the GPGPU driver 908 to enable the machine learning framework 904 to take advantage of hardware acceleration via the GPGPU hardware 910 without requiring the machine learning framework 904 to have intimate knowledge of the architecture of the GPGPU hardware 910. Additionally, the compute framework 1106 can enable hardware acceleration for the machine learning framework 904 across a variety of types and generations of the GPGPU hardware 910.

The computing architecture provided by embodiments described herein can be configured to perform the types of parallel processing that is particularly suited for training and deploying neural networks for machine learning. A neural network can be generalized as a network of functions having a graph relationship. As is known in the art, there are a variety of types of neural network implementations used in machine learning. One exemplary type of neural network is the feedforward network, as previously described.

A second exemplary type of neural network is the Convolutional Neural Network (CNN). A CNN is a specialized feedforward neural network for processing data having a known, grid-like topology, such as image data. Accordingly, CNNs are commonly used for compute vision and image recognition applications, but they also may be used for other types of pattern recognition such as speech and language processing. The nodes in the CNN input layer are organized into a set of "filters" (feature detectors inspired by the receptive fields found in the retina), and the output of each set of filters is propagated to nodes in successive layers of the network. The computations for a CNN include applying the convolution mathematical operation to each filter to produce the output of that filter. Convolution is a specialized kind of mathematical operation performed by two functions to produce a third function that is a modified version of one of the two original functions. In convolutional network terminology, the first function to the convolution can be referred to as the input, while the second function can be referred to as the convolution kernel. The output may be referred to as the feature map. For example, the input to a convolution layer can be a multidimensional array of data that defines the various color components of an input image. The convolution kernel can be a multidimensional array of parameters, where the parameters are adapted by the training process for the neural network.

Recurrent neural networks (RNNs) are a family of feedforward neural networks that include feedback connections between layers. RNNs enable modeling of sequential data by sharing parameter data across different parts of the neural network. The architecture for a RNN includes cycles. The cycles represent the influence of a present value of a variable on its own value at a future time, as at least a portion of the output data from the RNN is used as feedback for processing subsequent input in a sequence. This feature makes RNNs particularly useful for language processing due to the variable nature in which language data can be composed.

The figures described herein present exemplary feedforward, CNN, and RNN networks, as well as describe a general process for respectively training and deploying each of those types of networks. It will be understood that these descriptions are exemplary and non-limiting as to any specific embodiment described herein and the concepts illustrated can be applied generally to deep neural networks and machine learning techniques in general.

The exemplary neural networks described above can be used to perform deep learning. Deep learning is machine learning using deep neural networks. The deep neural networks used in deep learning are artificial neural networks composed of multiple hidden layers, as opposed to shallow neural networks that include only a single hidden layer. Deeper neural networks are generally more computationally intensive to train. However, the additional hidden layers of the network enable multistep pattern recognition that results in reduced output error relative to shallow machine learning techniques.

Deep neural networks used in deep learning typically include a front-end network to perform feature recognition coupled to a back-end network which represents a mathematical model that can perform operations (e.g., object classification, speech recognition, etc.) based on the feature representation provided to the model. Deep learning enables machine learning to be performed without requiring hand crafted feature engineering to be performed for the model. Instead, deep neural networks can learn features based on statistical structure or correlation within the input data. The learned features can be provided to a mathematical model that can map detected features to an output. The mathematical model used by the network is generally specialized for the specific task to be performed, and different models will be used to perform different task.

Once the neural network is structured, a learning model can be applied to the network to train the network to perform specific tasks. The learning model describes how to adjust the weights within the model to reduce the output error of the network. Backpropagation of errors is a common method used to train neural networks. An input vector is presented to the network for processing. The output of the network is compared to the desired output using a loss function and an error value is calculated for each of the neurons in the output layer. The error values are then propagated backwards until each neuron has an associated error value which roughly represents its contribution to the original output. The network can then learn from those errors using an algorithm, such as the stochastic gradient descent algorithm, to update the weights of the of the neural network.

Figure 10:
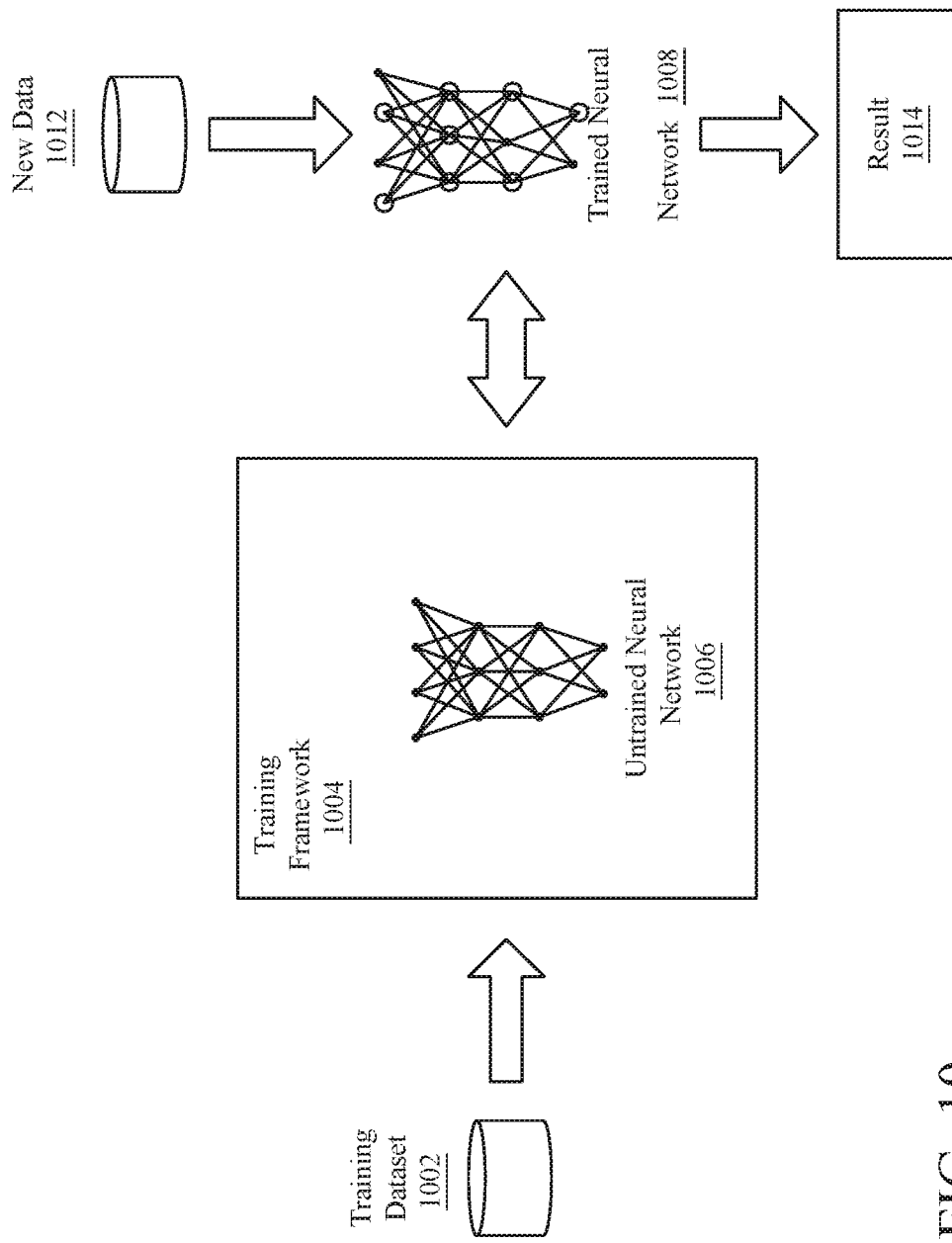
FIG. 10 illustrates training and deployment of a deep neural network in accordance with one or more embodiments.

FIG. 10 illustrates training and deployment of a deep neural network. Once a given network has been structured for a task the neural network is trained using a training dataset 1002. Various training frameworks have been developed to enable hardware acceleration of the training process. For example, the machine learning framework 904 of FIG. 9 may be configured as a training framework 1004. The training framework 1004 can hook into an untrained neural network 1006 and enable the untrained neural net to be trained using the parallel processing resources described herein to generate a trained neural network 1008. To start the training process the initial weights may be chosen randomly or by pre-training using a deep belief network. The training cycle then be performed in either a supervised or unsupervised manner.

Supervised learning is a learning method in which training is performed as a mediated operation, such as when the training dataset 1002 includes input paired with the desired output for the input, or where the training dataset includes input having known output and the output of the neural network is manually graded. The network processes the inputs and compares the resulting outputs against a set of expected or desired outputs. Errors are then propagated back through the system. The training framework 1004 can adjust to adjust the weights that control the untrained neural network 1006. The training framework 1004 can provide tools to monitor how well the untrained neural network 1006 is converging towards a model suitable to generating correct answers based on known input data. The training process occurs repeatedly as the weights of the network are adjusted to refine the output generated by the neural network. The training process can continue until the neural network reaches a statistically desired accuracy associated with a trained neural network 1208. The trained neural network 1008 can then be deployed to implement any number of machine learning operations.

Unsupervised learning is a learning method in which the network attempts to train itself using unlabeled data. Thus, for unsupervised learning the training dataset 1002 will include input data without any associated output data. The untrained neural network 1006 can learn groupings within the unlabeled input and can determine how individual inputs are related to the overall dataset. Unsupervised training can be used to generate a self-organizing map, which is a type of trained neural network 1007 capable of performing operations useful in reducing the dimensionality of data. Unsupervised training can also be used to perform anomaly detection, which allows the identification of data points in an input dataset that deviate from the normal patterns of the data.

Variations on supervised and unsupervised training may also be employed. Semi-supervised learning is a technique in which in the training dataset 1002 includes a mix of labeled and unlabeled data of the same distribution. Incremental learning is a variant of supervised learning in which input data is continuously used to further train the model. Incremental learning enables the trained neural network 1008 to adapt to the new data 1012 without forgetting the knowledge instilled within the network during initial training.

Whether supervised or unsupervised, the training process for particularly deep neural networks may be too computationally intensive for a single compute node. Instead of using a single compute node, a distributed network of computational nodes can be used to accelerate the training process.

The following examples pertain to further embodiments. Example one includes an apparatus of a multi-chip package (MCP) of a functional safety system, comprising a processor to be configured as a master chip in a master-slave arrangement with a slave chip in the MCP, and a memory coupled to the processor to store one or more infield test scan patterns, wherein the processor includes a bock to couple the master chip to the slave chip via a high-speed input/output (IO) interface to retrieve the one or more infield test scan patterns from the memory via the master chip, and to provide the one or more infield test scan patterns to the slave chip via the high-speed IO interface in response to the functional safety system entering an infield test mode. Example two may include the subject matter of example one or any of the examples described herein, wherein the master chip is to be configured as a primary controller hub (PCH) and the slave chip is to be configured as a central processing unit (CPU), or as any chip-to-chip, CPU to CPU, or CPU to PCH communication configuration. Example three may include the subject matter of example one or any of the examples described herein, wherein the high-speed IO interface comprises an I3C interface configured to enable multilane, double data rate transfer, or overclocking, or a combination thereof, to provide high-speed data transfer between the master chip and the slave chip. Example four may include the subject matter of example one or any of the examples described herein, wherein the master chip is to send a Clear Command Channel (CCC) command to the slave chip to indicate that the one or more infield test scan patterns are to be provided to the slave chip from the memory, and to configure the high-speed IO interface. Example five may include the subject matter of example one or any of the examples described herein, wherein the master chip is to transfer the one or more infield test scan patterns to the slave chip through sideband over the high-speed IO interface. Example six may include the subject matter of example one or any of the examples described herein, wherein a fixed static address is to be configured for the slave chip.

Example seven includes a multi-chip package (MCP) of a functional safety system comprising a first die to be configured as a master chip, a second die to be configured as a slave chip to the master chip in a master-slave arrangement, and a memory coupled to the first die to store one or more infield test scan patterns when the functional safety system is not in a diagnostic mode. wherein the processor includes an input/output (IO) engine to couple the master chip to the slave chip via a high-speed input/output IO interface to retrieve the one or more infield test scan patterns from the memory via the master chip and to provide the one or more infield test scan patterns to the slave chip via the high-speed IO interface in response to the functional safety system entering a diagnostic mode. Example eight may include the subject matter of example seven or any of the examples described herein, wherein the master chip is to be configured as a primary controller hub (PCH) and the slave chip is to be configured as a central processing unit (CPU), or as any chip-to-chip, CPU to CPU, or CPU to PCH communication configuration. Example nine may include the subject matter of example seven or any of the examples described herein, wherein the high-speed IO interface comprises an I3C interface configured to enable multilane, double data rate transfer, or overclocking, or a combination thereof, to provide high-speed data transfer between the master chip and the slave chip. Example ten may include the subject matter of example seven or any of the examples described herein, wherein the master chip is to send a Clear Command Channel (CCC) command to the slave chip to indicate that the one or more infield test scan patterns are to be provided to the slave chip from the memory, and to configure the high-speed IO interface. Example eleven may include the subject matter of example seven or any of the examples described herein, wherein the master chip is to transfer the one or more infield test scan patterns to the slave chip through sideband over the high-speed IO interface. Example twelve may include the subject matter of example seven or any of the examples described herein, wherein a fixed static address is to be configured for the slave chip.

Example thirteen includes method to implement an infield scan test in a multi-chip package (MCP) of a functional safety system comprising storing one or more infield test scan patterns in a storage device when the functional safety system is not in a diagnostic mode. fetching the one more infield test scan patterns form the storage device with a first chip of the MCP in response to the functional safety system entering the diagnostic mode, performing a functional safety test on one or more functional safety critical intellectual property (IP) modules of the first chip using the one or more infield test scan patterns, and transferring the one or more infield test scan patterns to a second chip of the MCP via a high-speed input/output (IO) interface between the first chip and the second chip, wherein the second chip is to perform a functional safety test on one or more functional safety critical IP modules of the second chip using the one or more infield test scan patterns. Example fourteen may include the subject matter of thirteen or any of the examples described herein, further comprising transferring the one or more infield test scan patterns to a third chip of the MCP via the high-speed input/output (IO) interface between the first chip and the third chip, wherein the third chip is to perform a functional safety test on one or more functional safety critical IP modules of the third chip using the one or more infield test scan patterns. Example fifteen may include the subject matter of thirteen or any of the examples described herein, further comprising sending a Clear Command Channel (CCC) command to the second chip to indicate that the one or more infield test scan patterns are to be provided to the second chip from the storage, and to configure the high-speed IO interface. Example sixteen may include the subject matter of thirteen or any of the examples described herein, further comprising configuring the first chip as a primary controller hub (PCH) in a master mode and configuring the second chip as a central processing unit (CPU) in a slave mode with a fixed device address, or as any chip-to-chip, CPU to CPU, or CPU to PCH communication configuration.

In example seventeen includes one or more non-transitory machine-readable media having instructions stored thereon that, when executed in a multi-chip package (MCP) of a functional safety system, result in storing one or more infield test scan patterns in a storage device when the functional safety system is not in a diagnostic mode, fetching the one more infield test scan patterns form the storage device with a first chip of the MCP in response to the functional safety system entering the diagnostic mode, performing a functional safety test on one or more functional safety critical intellectual property (IP) modules of the first chip using the one or more infield test scan patterns, and transferring the one or more infield test scan patterns to a second chip of the MCP via a high-speed input/output (IO) interface between the first chip and the second chip, wherein the second chip is to perform a functional safety test on one or more functional safety critical IP modules of the second chip using the one or more infield test scan patterns. Example eighteen may include the subject matter of seventeen or any of the examples described herein, wherein the instructions, when executed, further result in transferring the one or more infield test scan patterns to a third chip of the MCP via the high-speed input/output (IO) interface between the first chip and the third chip, wherein the third chip is to perform a functional safety test on one or more functional safety critical IP modules of the third chip using the one or more infield test scan patterns. Example nineteen may include the subject matter of seventeen or any of the examples described herein, wherein the instructions, when executed, further result in sending a Clear Command Channel (CCC) command to the second chip to indicate that the one or more infield test scan patterns are to be provided to the second chip from the storage, and to configure the high-speed IO interface. Example twenty may include the subject matter of seventeen or any of the examples described herein, wherein the instructions, when executed, further result in configuring the first chip as a primary controller hub (PCH) in a master mode and configuring the second chip as a central processing unit (CPU) in a slave mode with a fixed device address, or as any chip-to-chip, CPU to CPU, or CPU to PCH communication configuration.

In various embodiments, the operations discussed herein, e.g., with reference to the figures described herein, may be implemented as hardware (e.g., logic circuitry), software, firmware, or combinations thereof, which may be provided as a computer program product, e.g., including a tangible (e.g., non-transitory) machine-readable or computer-readable medium having stored thereon instructions (or software procedures) used to program a computer to perform a process discussed herein. The machine-readable medium may include a storage device such as those discussed with respect to the present figures.

Additionally, such computer-readable media may be downloaded as a computer program product, wherein the program may be transferred from a remote computer (e.g., a server) to a requesting computer (e.g., a client) by way of data signals provided in a carrier wave or other propagation medium via a communication link (e.g., a bus, a modem, or a network connection).

Reference in the specification to "one embodiment" or "an embodiment" means that a particular feature, structure, and/or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. An apparatus for offloading data, using a high-speed input/output interface comprising an I3C interface configured to enable multilane, double rate transfer, or a combination thereof, the apparatus comprising;
a first chip coupled to a second chip, the first chip is configured to:
transmit a Clear Command Channel (CCC) command to indicate use of a multilane communication mode to the second chip and to indicate using multilane double rate communication mode; and
transmit the data to the second chip using multiple lanes after the transmission of the Clear Command Channel (CCC) command.

2. The apparatus of claim 1, wherein the indication to configure I3C interface to enable multilane comprises an indication of using four serial data lanes.

3. The apparatus of claim 1, wherein the first chip is further configured to transmit error correction data using multiple lanes after the transmission of the data to the second chip using multiple lanes.

4. The apparatus of claim 3, wherein the transmitted error correction data comprises a word for cyclic redundancy check (CRC WORD) which is transmitted over the first data lane.

5. The apparatus of claim 4, wherein the first chip is further configured to transmit HDR Exit data after the word for cyclic redundancy check (CRC WORD) over the first data lane to conclude the transmission.

6. The apparatus of claim 1, wherein the first chip is further configured to transmit the data to the second chip using multiple lanes with a duration of multiples of 10 serial clocks (SCL).

7. The apparatus of claim 1, wherein the first chip is further configured to transmit the data to the second chip in double data rate (DDR).

8. The apparatus of claim 1, wherein a plurality of data packets is transmitted to the second chip after the transmission of the Clear Command Channel (CCC) command.

9. The apparatus of claim 1, wherein the first chip is a master chip and the second chip is a slave chip.

10. One or more non-transitory machine-readable media having instructions stored thereon that, when executed in an apparatus for offloading data, using a high-speed input/output interface comprising an I3C interface configured to enable multilane, double rate transfer, or a combination thereof result in:
transmitting a Clear Command Channel (CCC) command to indicate use of a multilane communication mode to a second chip and to indicate using multilane double rate communication mode; and
transmitting the data to the second chip using multiple lanes after the transmission of the Clear Command Channel (CCC) command.

11. The one or more non-transitory machine-readable media of claim 10, wherein the indication to configure I3C interface to enable multilane comprises an indication of using four serial data lanes.

12. The one or more non-transitory machine-readable media of claim 10, wherein the instructions, when executed further result in: transmitting error correction data using multiple lanes after the transmission of the data to the second chip using multiple lanes.

13. The one or more non-transitory machine-readable media of claim 12, wherein transmitting error correction data using multiple lanes comprises transmitting a word for cyclic redundancy check (CRC WORD) over the first data lane.

14. The one or more non-transitory machine-readable media of claim 13, wherein the instructions, when executed further result in: transmitting HDR Exit after the word for cyclic redundancy check (CRC WORD) over the first data lane in order to conclude the transmission.

15. The one or more non-transitory machine-readable media of claim 10, wherein transmitting the data to the second chip using multiple lanes has a duration of multiples of 10 serial clocks (SCL).

16. The one or more non-transitory machine-readable media of claim 10, wherein transmitting the data to the second chip using multiple lanes comprises transmitting in double data rate (DDR).

17. The one or more non-transitory machine-readable media of claim 10, wherein the instructions, when executed further result in: transmitting a plurality of data packets to the second chip after the transmission of the Clear Command Channel (CCC) command.

18. The one or more non-transitory machine-readable media of claim 10, wherein the first chip is a master chip and the second chip is a slave chip.

19. An apparatus for offloading data, using a high-speed input/output interface means comprising an I3C interface means configured to enable multilane, double rate transfer, or a combination thereof, the apparatus comprising:
   a first chip coupled to a second chip, the first chip comprising:
      means for transmitting a Clear Command Channel (CCC) command to indicate use of a multilane communication mode to the second chip and to indicate using multilane double rate mode; and
   means for transmitting the data to the second chip using multiple lanes after the transmission of the Clear Command Channel (CCC) command.

* * * * *